DOUBLE MASKING TECHNIQUE FOR INTEGRATED CIRCUIT

Filed July 8, 1966

INVENTOR

WILLIAM I. LEHRER,

BY [signature] & [signature]

ATTORNEYS.

United States Patent Office 3,498,833

Patented Mar. 3, 1970

3,498,833

DOUBLE MASKING TECHNIQUE FOR INTEGRATED CIRCUIT

William I. Lehrer, Los Altos, Calif., assignor to Fairchild Camera and Instrument Corporation, Syosset, N.Y., a corporation of Delaware Filed July 8, 1966, Ser. No. 563,740

Int. Cl. B44d *1/18, 1/52*

U.S. Cl. 117—212 8 Claims

ABSTRACT OF THE DISCLOSURE

A deposited pattern is sharply defined on a surface by use of a two-step lifting process. To do this, a first layer of liftable material is deposited on the surface in the shape of the desired pattern. Then a second layer of lifting material is deposited over the exposed surface and the first layer of liftable material. The first layer of liftable material is removed, leaving the second layer of lifting material to sharply define the desired pattern on the exposed surface. Metal, or other permanent material, is then deposited on both the exposed surface and the second layer of lifting material. Removal of this second layer of lifting material leaves on the surface the sharply defined metal pattern. Precise control of the surface temperature as a function of the thickness of the deposited material controls the depth of the alloy formed between the deposited material and the surface.

This invention relates to semiconductor device fabrication techniques and, more particularly, to the formation of multi-layered electrical contacts and interconnections for integrated circuits. The term "integrated circuit," as utilized herein, includes semiconductor circuits (wherein the circuit elements are formed within a semiconductor substrate), thin-film circuits (wherein the circuit elements are in the form of thin films on the surface of a substrate), and hybrid circuits which are a combination of the two types of circuits.

Upon completion of the active or passive portion of a circuit element, there usually follows process steps for forming contacts, for establishing interconnections, and for protecting the element or circuit with a passivating film. Prior art techniques have necessitated numerous process steps to create contacts, interconnections and surface passivation. The number of process steps required to form a particular contact is substantially increased when a contact having a plurality of layers of different materials is desired (i.e., a multi-layered contact). It is very desirable to limit the number of necessary process steps, not only to simplify fabrication and lower costs, but also in order to reduce handling and the consequent likelihood of breakage and contamination.

Various problems are encountered in forming metallic interconnections and contacts to semiconductor and associated materials. For example, in the thin-film and hybrid types of circuitry, the interconnections and contact materials must be compatible (e.g., adhere, form ohmic contact, etc.) with the different materials used for the various circuit elements and should be matched to the thermal dissipation and expansion characteristics of the circuit element materials. To provide a single material which meets all of these requirements, at best, involves compromise. With regard to semiconductor circuits, as well as thin-film and hybrid types, there is an inherent danger of over-alloying (i.e., too much contact material alloying with the material that forms the circuit element) with the attendant degradation of the electrical characteristics of the underlying thin films or regions of semiconductor material and in some cases an underlying semiconductor junction. Also, there is a danger of spreading of the contact material into undesired areas. This problem of "spikes" is very noticeable in tight (<0.1 mil) geometries.

To solve these problems with little compromise, a new method has been discovered whereby multi-layered contacts or interconnections may be formed. This new method significantly reduces the number of process steps required to form such contacts and enables the additional advantages of more precise process control, minimum risk of over-alloying and spreading, increased scratch resistance and, hence, an improvement in device quality. According to this invention, to define a selected pattern on a surface, a first layer of liftable masking material, that is, material which can be removed from the surface when desired, is formed on the surface in the desired pattern. The remaining portion of the surface is left exposed. Next, a second layer of lifting material, which likewise can be removed from the surface when desired, is deposited over the first layer of liftable masking material and the exposed portions of the surface. The first layer of liftable masking material is then removed from the surface to thereby expose the portion of the surface underlying the predetermined pattern. Successive layers of contact material are next deposited over both the remaining parts of the second layer of lifting material and the exposed portion of the surface. Finally, the second layer of lifting material is removed from the surface, thereby removing the overlying contact material deposited on this lifting material from the surface. Remaining on the surface in the predetermined selected pattern is the portion of the contact material deposited directly on the exposed portion of the surface previously defined by the first layer of liftable masking material.

The successive layers of contact material can, if desired, comprise the same material or layers of different materials. By heating the surface to the alloying temperature of the surface material and the contact layer, alloying between these two adjacent materials occurs. By limiting the thickness of the contact layer during this alloying process, alloy penetration into the underlying surface material is accurately controlled, thereby preventing the alloy from extending through thin films or active regions on the surface. After the surface temperature has been lowered to prevent further alloying, additional contact material can be deposited over the first layer of contact material. Because of the heating, the second layer of lifting material must be capable of withstanding the alloying temperature.

The novel features which are believed to be characteristic of the invention, both as to its organization and method of operation, together with further objects and advantages thereof, will be better understood from the following description considered in connection with the accompanying drawing which illustrates by way of example a portion of a hybrid integrated circuit in various stages of the fabrication in accordance with the present invention method. It is to be expressly understood, however, that the illustrated embodiment is for the purpose of description only and is not intended as a definition of the limits of the invention.

Figure 1:
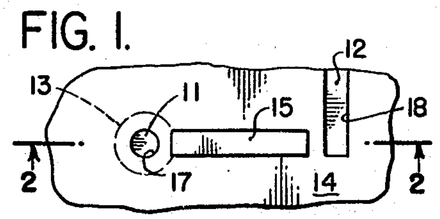
FIG. 1 is a plan view of a portion of a hybrid circuit.
Figure 2:
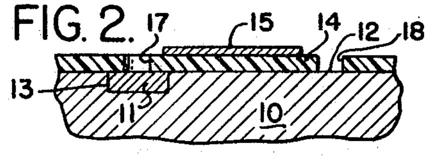
FIG. 2 is a sectional elevation view taken along the line 2—2 of FIG. 1.

For illustrative purposes the present invention method will be described with respect to a portion of a hybrid circuit wherein it is desired to form a conductive member (i.e., to establish contacts and an electrical connection) between regions of a semiconductor device and a thin-film resistor. FIGS. 1 and 2 show this circuit portion at that stage of fabrication wherein the circuit elements have been formed in accordance with known practices which are not a part of this invention and the circuit portion is ready to receive the passivating film and electrical connections. Specifically, there is shown a portion of a monocrystalline silicon substrate 10 of a predetermined conductivity type (e.g., N-type) and having an opposite conductivity type (e.g., P-type) diffused region 11 which is in part exposed on upper surface 12. Region 11 and substrate 10 form a PN junction 13 which extends to surface 12. Disposed on surface 12 is a passivating layer 14 (e.g., $SiO_2$) which is typically formed during a prior diffusion operation. A layer 15 of high-resistivity film material (e.g., nickel-chromium alloy) is disposed in a pattern atop the passivating layer to form a thin-film resistor.

A circular hole 17 is cut through passivating layer 14 to expose a portion of region 11 proximate one end of the resistor 15. An elongate cut 18 is scribed, etched, lifted or otherwise provided through passivating layer 14 and extends from a point proximate the other end of the resistance film pattern 15. The cut 18 exposes an elongate portion of substrate 10 (e.g., N-type) while opening 17 exposes regions 11 (e.g., P-type).

Figure 3:
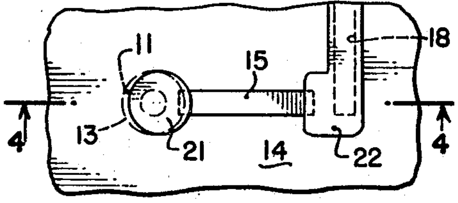
FIG. 3 is a plan view of that circuit portion shown in FIG. 1 at a subsequent stage of fabrication.
Figure 4:
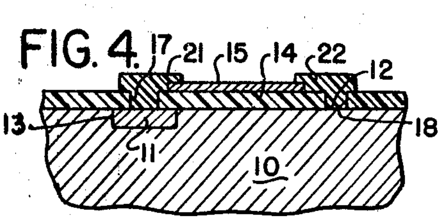
FIG. 4 is a sectional elevation view taken along the line 4—4 of FIG. 3.

Next, a layer of a conventional photo-resist material, such as that commonly known as AZ 1350, marketed by the Shipley Corporation, or other suitable masking material which can be lifted, that is, removed, taking with it any overlying material, is applied in the form of a continuous layer. The photo-resist is then exposed and developed according to well-known photoengraving techniques to leave image patterns 21 and 22 of photo-resist material, such as shown in FIGS. 3 and 4. The photo-resist pattern 21 fills the circular hole 17 and extends over one end portion of the film pattern 15. The photo-resist pattern 22 fills the elongate cut 18 and extends over the other end portion of film pattern 15. Thus, the desired electrical contact and interconnection pattern is defined by the photo-resist patterns 21 and 22. Note that the masking material pattern used in the present invention process is the converse of the usual masking pattern wherein the desired interconnections would be defined by exposed surface areas rather than by the masking material. This is because the masking material is used in a lifting step in the present process in order to enable sharp pattern definition in an overlying layer of lifting material, as will be hereinbelow explained.

Next, a passivating or dielectric film 26 (or layer of other protective material) followed by a thin film of lifting material 27 is formed over the photo-resist patterns. One embodiment of the invention utilizes well-known vacuum deposition techniques for establishment of these films, whereby the passive film and the succeeding lifting film can conveniently be deposited during the same pumpdown. Those skilled in the art will appreciate other methods suitable for establishment of these films.

Figure 5:
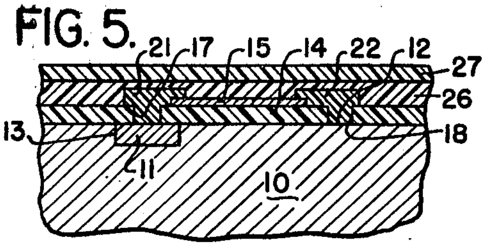
FIGS. 5–8 are sectional elevation views of the circuit portion in succeeding stages of fabrication; and, FIG. 9 is a schematic diagram of the completed electrical circuit shown by the illustrated circuit portion.

Upon establishment of these films, the illustrated circuit portion will appear as shown in FIG. 5, the passivating film being designated by the reference numeral 26 and the lifting film by the reference numeral 27. It is important to choose a lifting material 27 having a sufficiently high decomposition temperature so that it will not decompose at the temperatures encountered in alloying the contact and interconnection materials during a later fabrication step. Also, it is desirable that the lifting material be of a type which does not readily alloy with or chemically attack metals commonly employed in the electrical and integrated circuit arts, does not spatter during deposition, and is not affected by solutions commonly employed to remove photo-resist images. In addition, the lifting material chosen should be of a type which may be lifted by dilute acids, alkali, or organic agents which do not affect the other components or materials associated with semiconductor devices or integrated circuits. Suitable lifting materials possessing all of these desired characteristics are disclosed in co-pending U.S. patent application Ser. No. 509,825, now abandoned, entitled "Method of Forming Film Materials," filed Nov. 26, 1965, and assigned to the assignee of this invention. In one embodiment of the invention it is preferred that calcium fluoride ($CaF_2$) be employed. Calcium fluoride is insoluble in acetone which may be employed for the removal of photo-resist images. Yet, calcium fluoride is readily soluble in many common acids which do not alter other film materials, such as dilute sulfuric acid, dilute nitric acid, dilute hydrochloric acid, and other liquids, such as hot water and solutions of ammonium salts. The deposition of calcium fluoride can be carried out in standard vacuum deposition chambers with deposition occurring at about 1400° C., with no tendency to spatter. The useful temperature range of calcium fluoride is in excess of 1000° C. and there is no significant tendency to alloy or diffuse into the substrate or associated metals.

Figure 6:
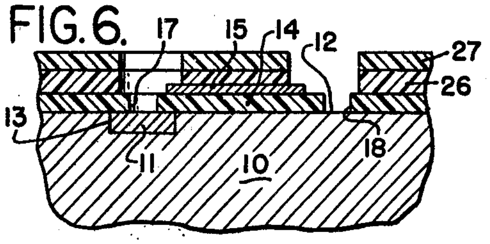

Following the establishment of the passivating film 26 and the overlying film of lifting material 27, the photo-resist image patterns 21 and 22 are removed by submerging the substrate 10, or that portion of the substrate containing the photo-resist images, in a suitable solvent (e.g., acetone or a mixture of acetone and alcohol). The application of the solvent removes the photo-resist image patterns 21 and 22 and the overlying portions of the films 26 and 27, thereby forming the lifting material into a pattern and exposing the predetermined contact and interconnection pattern. This removal is possible because of the porosity of the films 26 and 27, the solubility of the photo-resist patterns 21 and 22 in the solvent, and the inactivity of the solvent with respect to films 26 and 27. The use of this photo-resist lifting technique provides much sharper pattern definition than attainable by etching. Upon performance of this lifting step, a cross-section of the circuit portion will appear as shown in FIG. 6.

Next, substrate 10 is placed in an appropriate jig within a vacuum chamber, together with a source of conductive material to be used, electrical contact and interconnection material. The substrate 10 or surface portions thereof may be heated simultaneously or subsequently to the alloy temperature of the contact material. For example, when using aluminum as the contact material, heating of the substrate and aluminum would be to a temperature just below the aluminum-silicon eutectic, or on the order of 550° C. When depositing and alloying simultaneously, upon reaching the alloying temperature (e.g., 550° C.), a thin layer of contact material is evaporated onto the upper surface of the circuit portion, the deposition being continued until a contact layer thickness on the order of 1-2000 A. is formed. Thereafter, the device or substrate 10 is cooled to a temperature of about 150–300° C. The purpose of establishing a thin contact layer is to alloy only the minimum necessary amount to thereby avoid over-alloyed contacts. An additional advantage is that the possibility of temperature gradients through the layer thickness is eliminated in spite of the contact layer being very thin, thus enabling extremely close temperature control. At alloying temperatures on the order of 500° C. and greater, sufficient surface degassing occurs to insure an excellent mechanical and ohmic bond between the contact material and the underlying semiconductor or film materials.

Figure 7:
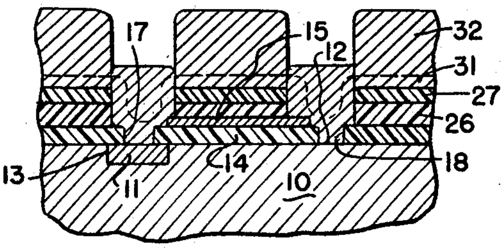

Then, further deposition of a suitable contact material is conducted with the circuit portion at a temperature well below the alloying temperature. No additional alloying occurs and the electroconductive layer thickness can be built up to any desired value using any suitable contact material. For example, a hard material such as chromium can be evaporated upon the original alloyed thin layer, followed by a thin layer of aluminum to facilitate bonding. Or, if desired, the contact may be nickel, gold or various combinations of other known contact materials, such as described in U.S. Patents No. 2,763,022 and No. 3,071,854. Upon completion of the initial alloying step followed by the further deposition of contact material, the circuit portion will appear as shown in FIG. 7 of the drawing. In FIG. 7 the reference numeral 31 designates the initial thin alloyed layer of contact material and the reference numeral 32 designates a subsequently deposited thicker layer of contact material. In the interest of clarity, only one additional layer is shown atop the first thin layer 31, although, as stated above, the thickness of the layer 32 may be made up of a plurality of layers of different types of contact materials selected to provide certain mechanical, thermal, electrical and other characteristics.

Figure 8:
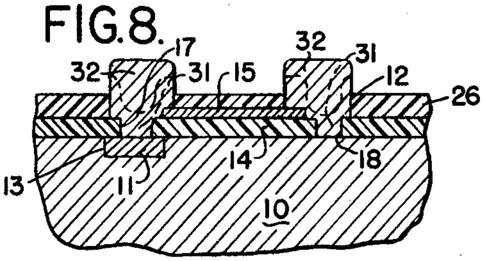

The final step in the process is the removal of the lifting material 27, along with the electrical contact material deposited thereon, whereby the remaining portions of contact layers 31 and 32 define the desired interconnections and contacts and passivating film 26 is exposed and protects the remaining surface portions. The lifting film 27 is removed by lifting with a suitable dilute acid, such as those mentioned hereinabove, which dissolves the lifting material without affecting any semiconductor substrate, passivating film and electrical contact materials. Upon completion of this second lifting step, the completed device appears as shown in FIG. 8. A plan view of the completed device is of the same general configuration as shown in FIG. 3.

Figure 9:
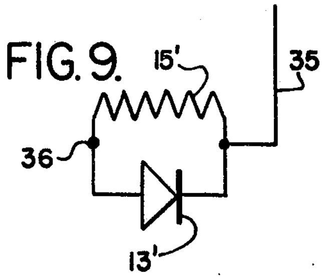

The interconnection pattern electrically connects the thin-film resistor 15 in shunt with the diode formed by PN junction 13 as shown in FIG. 9. An electrical lead 35 is formed by the contact material filling the cut 18, while an electrical terminal 36 is formed by the contact material filling the hole 17.

With respect to the above-described process, it should be noted that a process has been provided wherein a complex pattern of interconnections of a plurality of materials may be formed. The process requires a single lifting step to form a multi-layered network. An additional lifting step is employed to form the lifting material and a passivating layer. Thus, a double lifting procedure is within the scope of the invention.

What is claimed is:

1. The process of forming a multi-layered contact in a predetermined configuration on a surface, comprising the steps of:

(a) forming a layer of liftable masking material upon a surface in a pattern to cover a predetermined portion of the surface in said predetermined configuration while leaving the remaining portion of the surface exposed;

(b) establishing a layer of lifting material over the masking material pattern and the remaining exposed portion of said surface, said lifting material being one of the alkaline earth metal halides which has a decomposition temperature sufficiently high that the lifting material will not decompose at the alloying temperature of said contact and said surface;

(c) lifting the masking material pattern and the lifting material thereupon to thereby expose said predetermined part of said surface in said predetermined configuration;

(d) depositing successive layers of contact material over the layer of said lifting material and the exposed predetermined portion of said surface; and, (e) removing the lifting material and the contact material deposited thereon from said surface to form a multi-layered contact of said predetermined configuration on the exposed predetermined portion of said surface.

2. The process defined in claim 1, wherein said layer of lifting material is established by the deposition of calcium fluoride.

3. The process defined in claim 1, wherein the first of said successive layers of contact material is deposited at the alloying temperature of said contact material with the surface material.

4. The process defined in claim 1, wherein the first of said successive layers of contact material is deposited at the alloying temperature of said contact material with the surface material and wherein the decomposition temperature of said lifting material is higher than said alloying temperature.

5. The process defined in claim 1, wherein the first layer of contact material is deposited at the alloying temperature of the contact material with the surface material and wherein the subsequent layers of contact material are deposited at a temperature sufficiently below said alloying temperature so that no additional alloying occurs.

6. The process of forming a multi-layered contact in a predetermined configuration on a surface, comprising the steps of:

(a) forming a layer of liftable masking material upon a surface in a pattern to cover a predetermined portion of the surface in said predetermined configuration while leaving the remaining portion of the surface exposed;

(b) establishing a layer of insulating material over the masking material pattern and the remaining exposed portion of said surface;

(c) establishing a layer of lifting material atop the layer of insulating material, said lifting material havng a sufficiently high decomposition temperature so that it will not decompose at the alloying temperature of said contact and said surface;

(d) lifting the masking material pattern and the insulating material and lifting material thereupon to thereby expose said predetermined part of said surface in said predetermined configuration;

(e) depositing successive layers of contact material over the layer of said lifting material and the exposed predetermined portion of said surface; and, (f) removing the lifting material and the contact material deposited thereon to form a multi-layered contact of said predetermined configuration on the exposed predetermined portion of said surface with the remaining portion of said surface being covered by said layer of insulating material.

7. The process defined in claim 6, wherein the surface upon which the multi-layered contact is formed is one surface of an integrated circuit and wherein said predetermined configuration of the multi-layered contact includes a plurality of contacts.

8. The process defined in claim 6 wherein said layer of insulating material also serves as a passivating layer.

References Cited

UNITED STATES PATENTS

| | | | |
|---|---|---|---|
| 2,995,461 | 8/1961 | Bolcey et al. | 117—3.5 |
| 2,923,624 | 2/1960 | Hensler | 96—35 |
| 2,748,031 | 5/1956 | Kafig | 117—212 |
| 3,379,568 | 4/1968 | Holmes | 117—47 |

ALFRED L. LEAVITT, Primary Examiner

A. GRIMALDI, Assistant Examiner

U.S. Cl. X.R.

29—578; 117—5.5; 156—17